United States Patent
Arnold et al.

(10) Patent No.: US 9,117,873 B2
(45) Date of Patent: Aug. 25, 2015

(54) DIRECT MULTIPLE SUBSTRATE DIE ASSEMBLY

(71) Applicant: Apple Inc., Cupertino, CA (US)

(72) Inventors: Shawn X. Arnold, San Jose, CA (US); Matthew E. Last, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/629,560

(22) Filed: Sep. 27, 2012

(65) Prior Publication Data

US 2014/0084454 A1 Mar. 27, 2014

(51) Int. Cl.
| | |
|---|---|
| H01L 23/48 | (2006.01) |
| H01L 23/52 | (2006.01) |
| H01L 29/40 | (2006.01) |
| H01L 23/02 | (2006.01) |
| H01L 23/12 | (2006.01) |
| H01L 21/762 | (2006.01) |
| H01L 23/498 | (2006.01) |
| H01L 25/065 | (2006.01) |
| H01L 23/00 | (2006.01) |
| H01L 29/06 | (2006.01) |

(52) U.S. Cl.
CPC ............ *H01L 21/762* (2013.01); *H01L 23/498* (2013.01); *H01L 24/26* (2013.01); *H01L 25/0655* (2013.01); *H01L 25/0657* (2013.01); *H01L 29/0657* (2013.01); *H01L 2224/16145* (2013.01); *H01L 2225/06513* (2013.01); *H01L 2225/06527* (2013.01); *H01L 2225/06551* (2013.01); *H01L 2225/06593* (2013.01); *H01L 2924/0002* (2013.01); *H01L 2924/10156* (2013.01)

(58) Field of Classification Search
CPC ........... H01L 2924/01078; H01L 2924/01079; H01L 2224/13099; H01L 2924/14; H01L 2224/48091; H01L 2924/01013; H01L 23/5226; H01L 2924/01029
USPC ......... 257/737, 685, 723, 730, 731, 773, 774, 257/782, 786
See application file for complete search history.

(56) References Cited

U.S. PATENT DOCUMENTS

| | | | |
|---|---|---|---|
| 5,350,945 | A | 9/1994 | Hayakawa |
| 5,945,725 | A | 8/1999 | Ishikawa |
| 7,595,223 | B2 | 9/2009 | Mastromatteo et al. |
| 7,632,131 | B2 * | 12/2009 | Lee ................................ 439/353 |
| 7,884,464 | B2 | 2/2011 | Yew et al. |
| 8,354,301 | B2 * | 1/2013 | Roberts et al. ................ 438/109 |
| 2012/0280308 | A1 * | 11/2012 | Disney .......................... 257/329 |

* cited by examiner

*Primary Examiner* — A. Sefer
*Assistant Examiner* — Dilinh Nguyen
(74) *Attorney, Agent, or Firm* — Downey Brand LLP

(57) ABSTRACT

A direct multiple substrate die assembly can include a first and a second substrate, wherein each substrate can include at least one interlocking edge feature. An electrical interconnection area can be formed adjacent to or within the interlocking edge feature on each substrate and can be configured to couple one or more electrical signals between the substrates. In one embodiment, the interlocking edge feature can include one or more keying features that can enable accurate alignment between the substrates. In yet another embodiment, the direct multiple substrate die assembly can be mounted out of plane with respect to a supporting substrate.

9 Claims, 7 Drawing Sheets

DIRECT MULTIPLE SUBSTRATE DIE ASSEMBLY

FIELD OF THE DESCRIBED EMBODIMENTS

The described embodiments relate generally to substrate assemblies, and more particularly to direct substrate assembly between multiple substrates.

BACKGROUND

Integrated circuits have long become a mainstay of many electronic designs. Many items such as processors, memories, custom electronic designs including application specific integrated circuits (ASICs), field programmable gate arrays and sensors use integrated circuit device technology to manufacture these items. Integrated circuit technologies can produce devices en masse, typically on a common substrate referred to as a wafer.

In some applications, two or more substrates can be electrically coupled together to form an assembly. Oftentimes, the assembly is large and can consume too much volume. Furthermore, the signal quality of the pathways electrically coupling the substrates can be affected by an abundance of junctions or other impediments in a signal pathway.

Therefore, what is desired is a compact way to couple substrates together and enhance the quality of electrical signals between the coupled substrates.

SUMMARY OF THE DESCRIBED EMBODIMENTS

This paper describes various embodiments that relate to multiple substrate assemblies. In one embodiment a multiple shaped-interface substrate assembly can include a first substrate with an electrical component area and an interlocking edge that can include a thinned region and a first electrical interface region positioned next to the thinned region. The assembly can further include a second substrate with an electrical component area and an interlocking edge that can also include a thinned region and a second electrical interface region positioned next to the thinned region wherein the first substrate can be electrically and mechanically bonded to the second substrate.

In another embodiment, a method for forming a multiple shaped-interface assembly can include the steps of receiving a first and a second substrate, forming a first shaped edge region on the first substrate including a thinned region, disposing a first electrical interface region next to the first shaped edge region, forming a second shaped edge region on the second substrate including a thinned region, disposing a second electrical interface region next to the second shaped edge region, and bonding the first substrate to the second substrate through the first and second shaped edge regions.

In yet another embodiment, computer code for forming a substrate assembly can include computer code for receiving a first and a second substrate, computer code for forming a first shaped edge region, computer code for disposing a first electrical interface region adjacent to the first shaped edge region, computer code for forming a second edge shaped region, computer code for disposing a second electrical interface region adjacent to the second shaped edge region and computer code for bonding the first substrate to the second substrate through the first and the second shaped edge regions.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The embodiments will be readily understood by the following detailed description in conjunction with the accompanying drawings, wherein like reference numerals designate like structural elements.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Substrates for electrical devices often need to be coupled to other components or other substrates. Unfortunately, the many traditional approaches can require extensive volume to implement and can also can offer degraded signal quality for signals coupled between substrates.

In one embodiment, shaped edge regions can be formed on substrates to provide a region for establishing a mechanical bond between substrates. The shaped edge regions can also include an electrical interface area that can provide an electrical coupling between substrates. In one embodiment, the shaped edge regions can include a keying feature to help assist in alignment and orientation between substrates.

Figure 1:
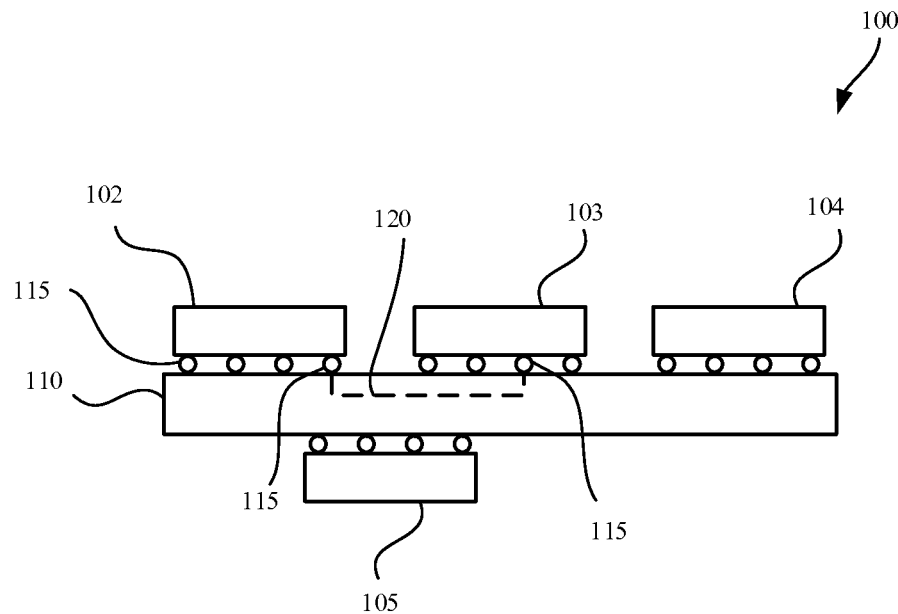
FIG. 1 is a simplified block diagram of a prior art assembly for interconnecting one or more substrates together.

FIG. 1 is a simplified block diagram 100 of a prior art assembly for interconnecting one or more substrates together. In one embodiment, a substrate can be an integrated circuit with electrical contracts, as shown. FIG. 1 shows four substrates 102-105. Each substrate 102-105 can be a different device. For example, in one embodiment, substrate 102 can be a processor while substrate 103 can be a memory device (RAM/DRAM etc.). Each substrate 102-105 can include electrical contacts, such as ball 115. The electrical contacts 115 can affix substrates to an interconnecting substrate 110. Electrical signals can be coupled between substrates with conductive elements included within interconnecting substrate 110. For example conductive trace 120 can couple a signal between substrate 102 and substrate 103.

Substrates 102-105 can be formed on silicon, gallium arsenide, germanium, gallium nitride any other technically feasible substrate. Interconnecting substrate 110 can be similar to the substrates 102-105, or, in another embodiment, interconnecting substrate 110 can be a printed circuit board assembly. Conductive elements within the interconnecting substrate can be metalized layers, conductively doped regions, copper traces or any other technically feasible electrical conductor.

As shown, interconnections between substrates generally begin at a first contract 115, travel through the interconnecting substrate 110 and traverse a second contact 115. Each contact, as well as the interconnecting substrate, can add parasitic circuit elements such as inductance, resistance and capacitance that can adversely affect signal quality.

Figure 2:
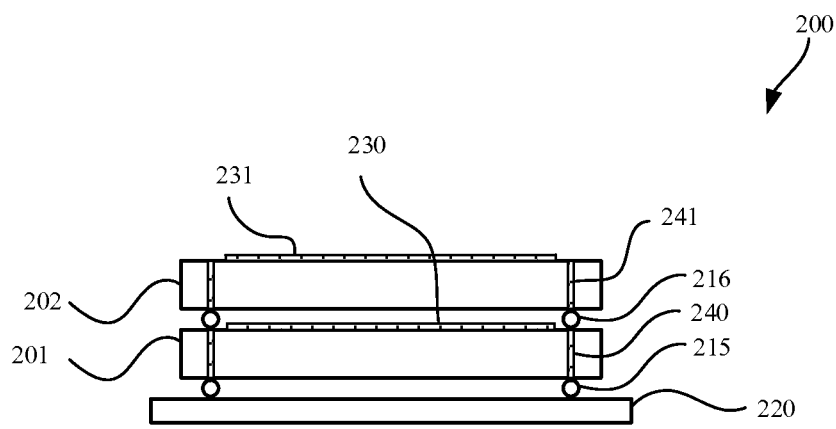
FIG. 2 is a simplified block diagram of a prior art stacked substrate assembly.

FIG. 2 is a simplified block diagram 200 of a prior art stacked substrate assembly. The assembly can include a first substrate 201 and a second substrate 202. The first substrate 201 can include electronic elements (transistors, gates, cells etc.) formed within circuit region 230. The first substrate can also include electrical contacts 215 that electrically and mechanically affix first substrate 201 to a printed circuit board 220. Similarly, the second substrate 202 can also include electronic elements in circuit region 231 and electrical contacts 216.

The second substrate 202 can electrically couple to the first substrate 201 by means of electrical contact 216 and silicon through vias 240. In another embodiment, The second substrate can electrically couple to the printed circuit board 220 by coupling a signal through silicon through via 241, electrical contact 216, silicon through via 240 and electrical contact 215. Parasitic circuit elements can still be encountered as a signal travels through multiple silicon through vias 240, 241 and electrical contacts 215 and 216 again adversely affecting signal quality.

Figure 3A:
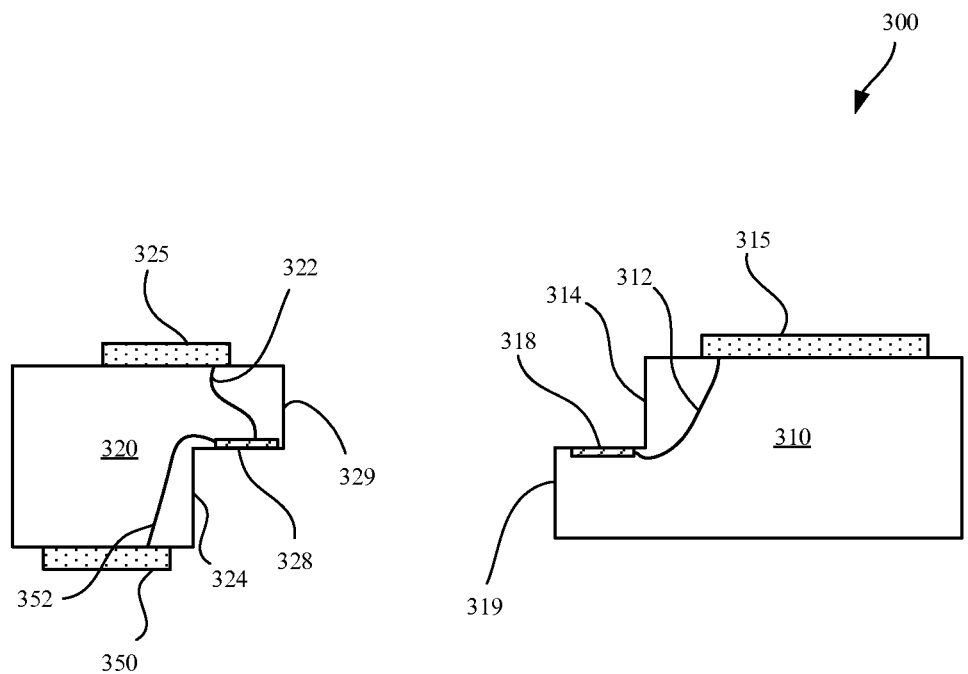
FIGS. 3A and 3B are simplified block diagrams of a substrate assembly including two substrates with shaped edge features in accordance with one embodiment described in the specification.
Figure 3B:
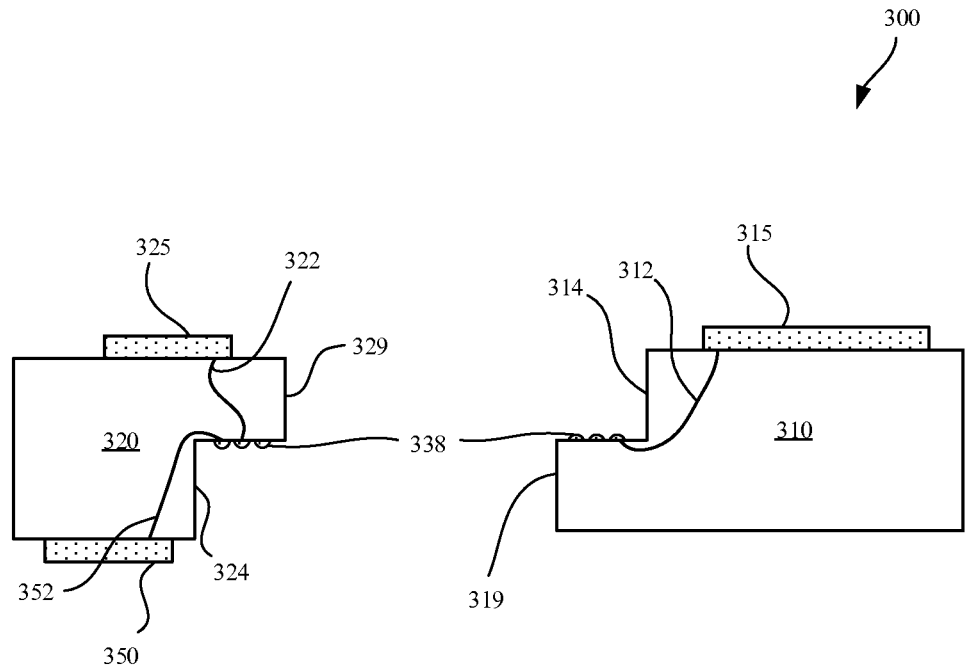

FIGS. 3A and 3B are simplified block diagrams of a substrate assembly 300 including two substrates with shaped edge features in accordance with one embodiment described in the specification. The assembly 300 shows two substrates, but any number of substrates can be used. The first substrate 310 can include a circuit region 315 and a shaped edge region 314. Circuit region 315 can include transistors, gates and cells as described above. The second substrate 320 can also include circuit region 325 and shaped edge region 324.

The shaped edge regions 314 and 324 can include electrical interface regions 318 and 328 respectively. First substrate 310 can include a conductive element 312 coupling electrical interface region 318 to circuit region 315 and second substrate 320 can include a conductive element 322 coupling electrical interface region 328 to circuit region 325. Although conductive elements 312 and 322 are drawn internal to first and second substrates 310 and 320, any technically feasible conductive elements can be used, including conductive doping or metal layers disposed on a surface of the first and second substrates 310 and 320. Electrical interface regions 318 and 328 can include surface contacts, gold stud bumps 338, deposited metal contacts or any other technically feasible electrical contact.

Shaped edge regions can include a thinned region. In FIGS. 3A and 3B, the shaped edge region 314 includes thinned region 319 and shaped edge region 324 includes thinned region 329. The thinned regions 319, 329 can be configured to enable the shaped edge regions 314, 324 to overlap and interlock with respect to each other. Shaped edge regions 314 and 324 can be formed through a deep reactive ion etch (DRIE) process. In one embodiment, electrical interface regions can be disposed adjacent to the thinned regions. For example, electrical interface region 318 can be disposed on thinned region 319 and electrical interface region 328 can be disposed on thinned region 329. As the thinned regions 319 and 329 overlap, electrical interface regions 318 and 328 can also overlap and signals can be coupled between electrical interface regions. This is described in more detail in FIG. 4.

In other embodiment, circuit regions can be formed on a different side of a substrate (with respect to shaped edge regions). This embodiment is illustrated in FIGS. 3A and 3B with an alternative circuit region 350 disposed on substrate 320. Conductive elements 352 can couple circuit region 350 to electrical interface region 328. In some embodiments, formation of substrate 320 can be simplified by controlling a positional relationship between a circuit region (in this example, circuit regions 325 and 352) and a shaped edge region 324. In some embodiments, substrates 310 and 320 can be thinned substrates. A substrate can be thinned to reduce an overall high of the substrate. This thinned substrate can advantageously be used in low-profile devices where component height is critical. Substrates can be thinned by grinding, back lapping or any other technically feasible method.

Figure 4:
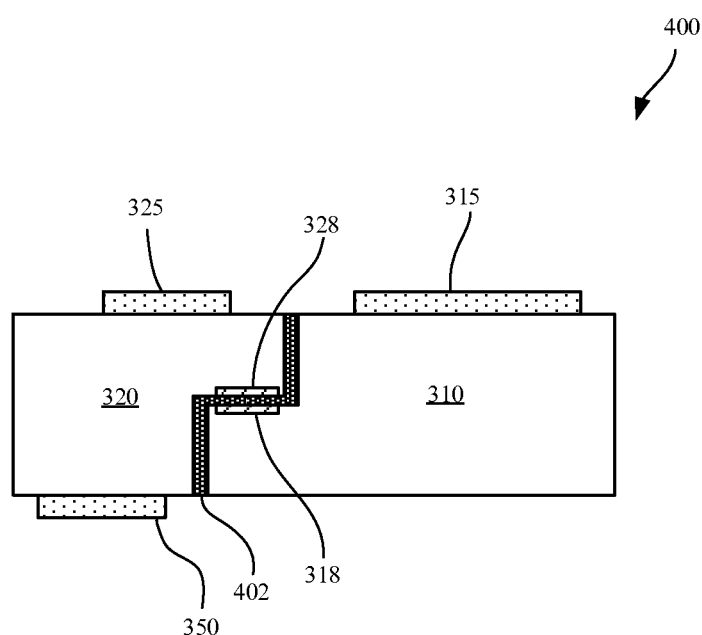
FIG. 4 is a simplified block diagram showing a substrate assembly with two substrates positioned to overlap their respective shaped edge features.

FIG. 4 is a simplified block diagram showing substrate assembly 400 such that the two substrates 310 and 320 are positioned to overlap their respective shaped edge features. As shown, electrical interface regions 318 and 328 can be positioned proximate to each other such that electrical couplings between the two interface regions can be established. That is, an electrical signal can traverse directly from one substrate to another, without encountering excessive parasitic electrical elements. For example, a signal can travel from circuit region 325, through conductive element 322, through electrical interface regions 328 and 318, through conductive element 312 to circuit region 315. In one embodiment, a conductive epoxy 402 can be disposed between substrates 310 and 320 to electrically and mechanically couple the substrates together. In another embodiment, electrical interface regions 318 and 328 can be bonded together using solder balls, a thermo-compressive adhesive or any technically feasible conductive adhesive.

The substrates shown in FIG. 4 can advantageously be based on different integrated device technologies. For example, a first substrate can be complementary metal oxide silicon (CMOS) while a second substrate can be an analog design. Differing integrated circuit feature sizes can be used by different substrates. For example, a first substrate can be based on a 22 nanometer device (transistor) feature size while a second substrate can be based on a 55 nanometer device feature size. Any two substrates can be coupled together with the shaped feature region being the only common element between the two substrates. Thus, the assembly illustrated in FIGS. 3 and 4 can enable the formation of non-homogenous device assemblies using any two substrate types. In another embodiment, substrate 320 can include circuit region 350 instead of (or in addition to) circuit region 325.

Figure 5A:
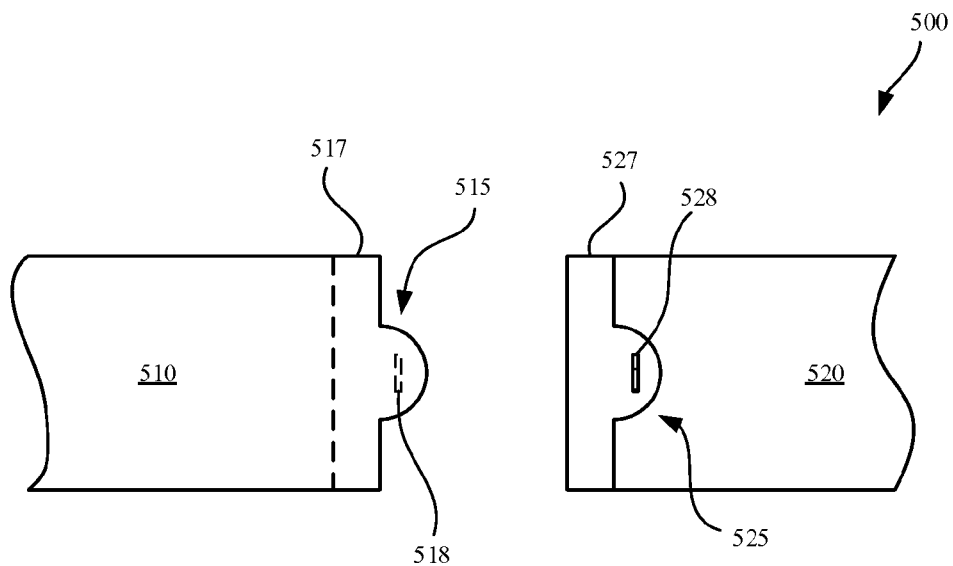
FIGS. 5A and 5B are simplified block diagrams of another embodiment of a substrate assembly.
Figure 5B:
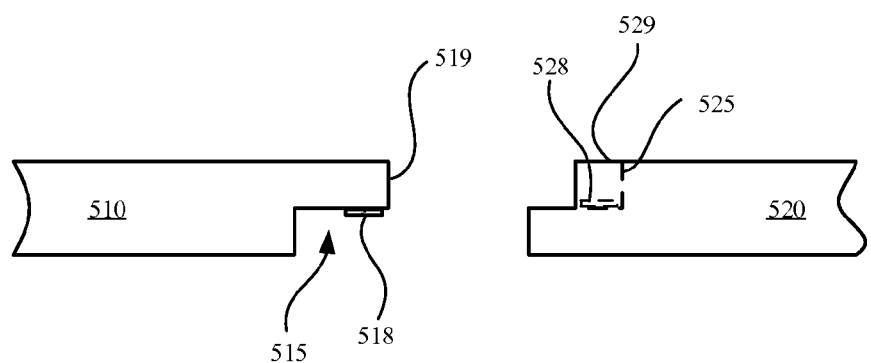

FIGS. 5A and 5B are simplified block diagrams of another embodiment of a substrate assembly 500. In this embodiment, shaped edge regions can include a keying feature that can assist in aligning substrates together. If a substrate assembly includes more than two substrates, then the keying features can assist in coupling the substrates in a particular order. Circuit regions and conductive elements have been omitted from this figure to simplify and clarify the illustration. FIG. 5A is a top view of two substrates. A first substrate 510 can include a first keying feature 515 with a first electrical contact 518 disposed on shaped edge region 517, while a second substrate 520 can include a second keying feature 525 configured to accept the first keying feature 515, with the second keying feature 525 having a second electrical contact 528 on a second shaped edge region 527. In other embodiments two or more keying features can be disposed on the shaped edge regions. In one embodiment, the keying feature can be formed in a thinned region 519. In another embodiment, the keying feature can be formed on a non-thinned region 529. FIG. 5B is a side view of the two substrates further illustrating keying features 515 and 525. The dashed lines in FIGS. 5A and 5B can represent hidden lines showing a feature that may be occluded in a particular view.

Figure 6:
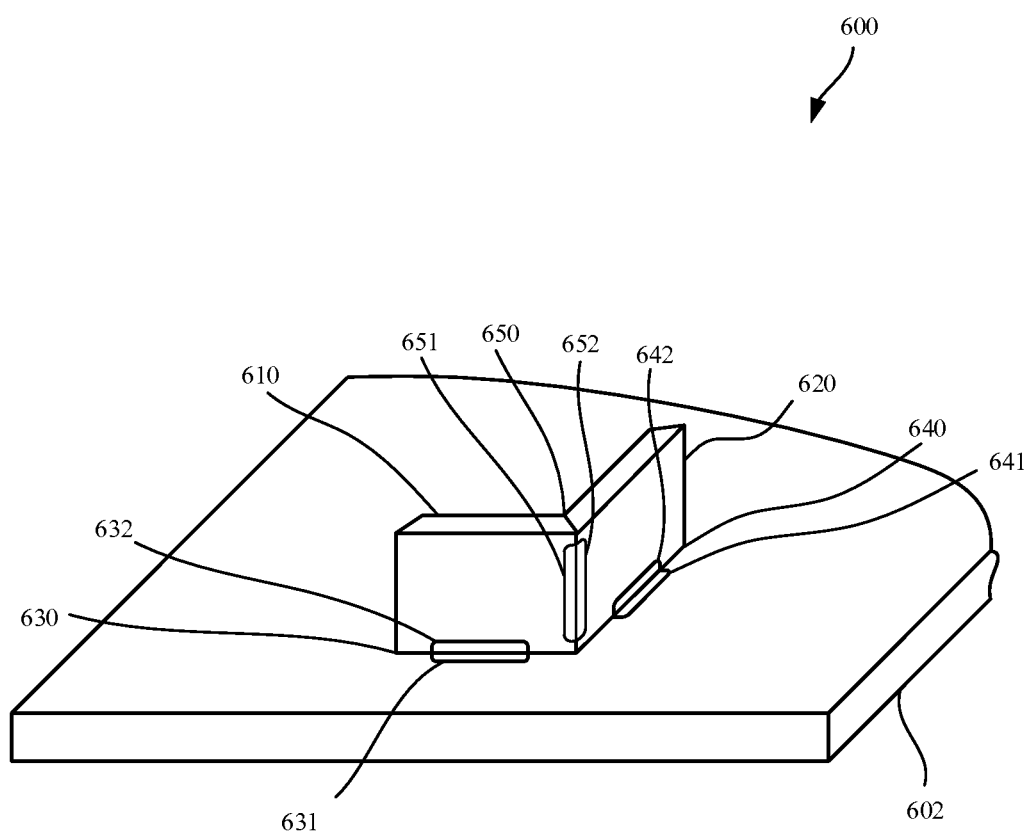
FIG. 6 is a simplified block diagram of yet another embodiment of a substrate assembly.

FIG. 6 is a simplified block diagram of yet another embodiment of a substrate assembly 600. The assembly 600 can include a first substrate 610 and a second substrate 620. Other embodiments can include other numbers of substrates. The assembly 600 can also include support substrate 602. In one embodiment, support substrate 602 can be a printed circuit board. In another embodiment, support substrate 602 can be silicon, gallium arsenide, germanium or any other technically feasible substrate.

Substrates 610 and 620 can include edge shaped regions as before, but in this embodiment the shaped edge regions can not only enable mechanical and electrical bonding between substrates, but also mechanical and electrical bonding to support substrate 602. In one embodiment substrates 610 and 620 can be mounted on support substrate 602 such that substrates 610 and 620 are positioned out of the plane of support substrate 602. When substrates 610 and 620 comprise sensors, then assembly 600 can configure sensors to be sensitive to activity not restricted to the plane of the support substrate 602.

Shaped edge region 650 can be shared between substrates 610 and 620. Substrate 610 can include electrical interface region 651 and substrate 620 can include electrical interface region 652. When substrate 610 is electrically and mechanically bonded to substrate 620, then electrical signals can advantageously be coupled from substrate 610 through electrical interface regions 651 and 652 to substrate 620. Similarly, substrate 610 can be electrically and mechanically bonded to support substrate 602 at shaped edge region 630. Support substrate 602 can include electrical interface region 631 and substrate 610 can include electrical interface region 632. Electrical signals can be coupled between substrate 610 and support substrate 602 through electrical interface regions 631 and 632. In a like manner, substrate 620 can be electrically and mechanically bonded to support substrate 602 at shaped edge region 640. Support substrate 602 can include electrical interface region 641 and substrate 610 can include electrical interface region 642. Electrical signals can be coupled between substrate 610 and support substrate 602 through electrical interface regions 641 and 642.

Figure 7:
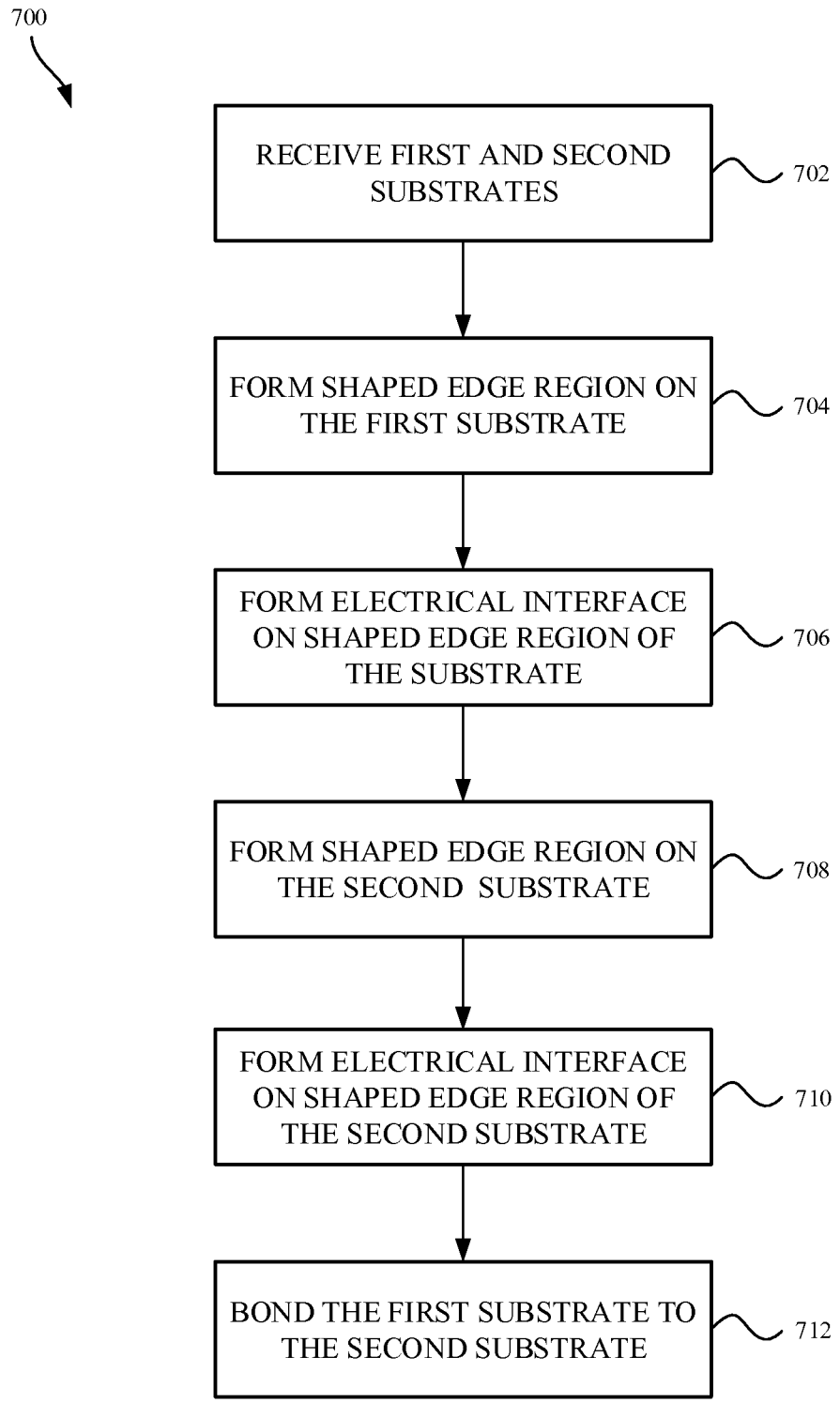
FIG. 7 is a flow chart of method steps for forming a shaped substrate assembly in accordance with one embodiment described in the specification.

FIG. 7 is a flow chart of method steps 700 for forming a shaped substrate assembly in accordance with one embodiment described in the specification. Persons skilled in the art will understand that any system configured to perform the method steps in any order is within the scope of this description. The method begins in step 702 where a first and a second substrate are received. In step 704, a shaped edge region is formed on the first substrate. In step 706, an electrical interface region is formed adjacent to the shaped edge region of the first substrate. In step 708, a shaped region is formed on the second substrate. In step 710, an electrical interface region is formed adjacent to the shaped region on the second substrate. In step 712, the first substrate is bonded to the second substrate through the shaped edge regions. In one embodiment, the bonding can couple the electrical interface region of the first substrate to the electrical interface region of the second substrate.

Figure 8:
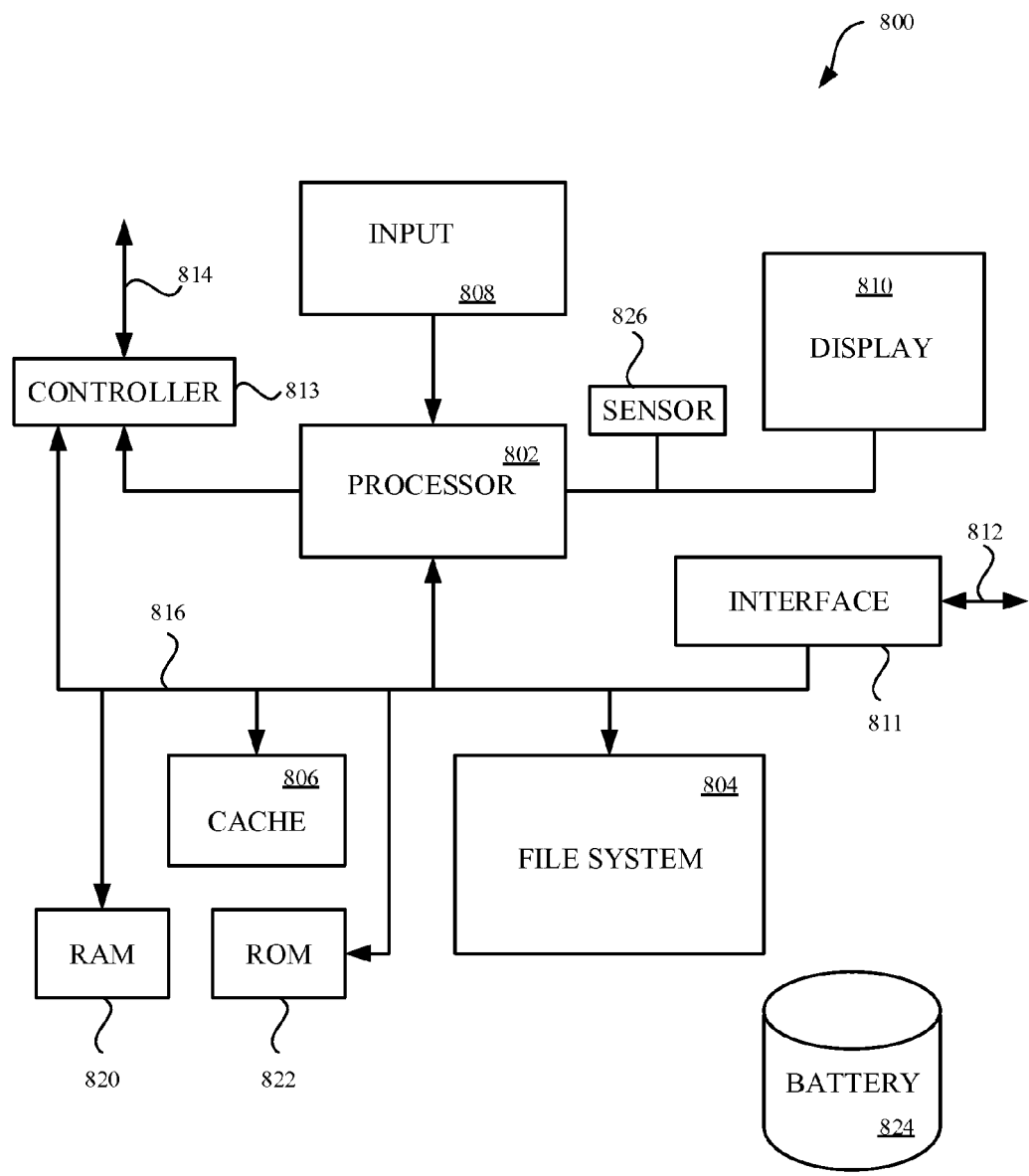
FIG. 8 is a block diagram of an electronic device suitable for controlling some of the processes in the described embodiment.

FIG. 8 is a block diagram of an electronic device suitable for controlling some of the processes in the described embodiment. Electronic device 800 can illustrate circuitry of a representative computing device. Electronic device 800 can include a processor 802 that pertains to a microprocessor or controller for controlling the overall operation of electronic device 800. Electronic device 800 can include instruction data pertaining to manufacturing instructions in a file system 804 and a cache806. File system 804 can be a storage disk or a plurality of disks. In some embodiments, file system 804 can be flash memory, semiconductor (solid state) memory or the like. The file system 804 can typically provide high capacity storage capability for the electronic device 800. However, since the access time to the file system 804 can be relatively slow (especially if file system 804 includes a mechanical disk drive), the electronic device 800 can also include cache 806. The cache 806 can include, for example, Random-Access Memory (RAM) provided by semiconductor memory. The relative access time to the cache 806 can substantially shorter than for the file system 804. However, cache 806 may not have the large storage capacity of file system 804. Further, file system 804, when active, can consume more power than cache 806. Power consumption often can be a concern when the electronic device 800 is a portable device that is powered by battery 824. The electronic device 800 can also include a RAM 820 and a Read-Only Memory (ROM) 822. The ROM 822 can store programs, utilities or processes to be executed in a non-volatile manner. The RAM 820 can provide volatile data storage, such as for cache 806.

Electronic device 800 can also include user input device 808 that allows a user of the electronic device 800 to interact with the electronic device 800. For example, user input device 808 can take a variety of forms, such as a button, keypad, dial, touch screen, audio input interface, visual/image capture input interface, input in the form of sensor data, etc. Still further, electronic device 800 can include a display 810 (screen display) that can be controlled by processor 802 to display information to the user. Data bus 816 can facilitate data transfer between at least file system 804, cache 806, processor 802, and controller 813. Controller 813 can be used to interface with and control different manufacturing equipment through equipment control bus 814. For example, control bus 814 can be used to control a computer numerical control (CNC) mill, a press, an injection molding machine, soldering machine, deep ion reactive ion etch equipment or other such equipment. For example, processor 802, upon a certain manufacturing event occurring, can supply instructions to control manufacturing equipment through controller 813 and control bus 814. Such instructions can be stored in file system 804, RAM 820, ROM822 or cache 806.

Electronic device 800 can also include a network/bus interface 811 that couples to data link 812. Data link 812 can allow electronic device 800 to couple to a host computer or to accessory devices. The data link 812 can be provided over a wired connection or a wireless connection. In the case of a wireless connection, network/bus interface 811 can include a wireless transceiver. Sensor 826 can take the form of circuitry for detecting any number of stimuli. For example, sensor 826 can include any number of sensors for monitoring a manufacturing operation such as for example a Hall Effect sensor responsive to external magnetic field, an audio sensor, a light sensor such as a photometer, computer vision sensor to detect clarity, a temperature sensor to monitor a etching process and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A substrate assembly, comprising:
    a first substrate having a first circuit on a first top surface, a first keying feature having a first electrical contact, the first electrical contact electrically connected to the first circuit via a first conductive element;
    a second substrate having a second circuit on a second top surface, a second keying feature having a second electrical contact, the second electrical contact electrically connected to the second circuit via a second conductive element; and
    wherein when the first keying feature engages the second keying feature, the first top surface and the second top surface form a uniform top surface, the first circuit is electrically connected to the second circuit.

2. The substrate assembly according to claim 1, wherein the first keying feature aligns the first substrate with the second substrate.

3. The substrate assembly according to claim 1, wherein the first top surface is substantially co-planar with the second top surface when the first substrate and the second substrate are joined.

4. The substrate assembly according to claim 1, wherein the first conductive element is a wire.

5. The substrate assembly according to claim 1, wherein the second substrate includes a third circuit on a bottom surface of the second substrate, the bottom surface opposite the second top surface, and wherein the third circuit is electrically connected to the first circuit.

6. The substrate assembly according to claim 1, wherein:
    the first keying feature includes a first surface perpendicular to a second surface;
    the second keying feature includes a third surface perpendicular to a fourth surface; and
    when the first keying feature engages the second keying feature, the first surface engages the third surface, and the second surface engages the fourth surface.

7. The substrate assembly according to claim 1, wherein a connection means for the first keying feature and the second keying feature is selected from conductive epoxy or solder.

8. The substrate assembly according to claim 1, wherein the first substrate and the second substrate are magnetically coupled together.

9. The substrate assembly according to claim 1, wherein the first keying feature includes a rounded region extending outward with respect to the first substrate, and wherein the second keying feature includes a rounded region extending inward with respect to the second substrate.

* * * * *